(12) United States Patent
Taguchi et al.

(10) Patent No.: US 12,181,323 B2
(45) Date of Patent: Dec. 31, 2024

(54) MATERIAL SUPPLY SYSTEM, A STORAGE MEDIUM STORING A PROGRAM FOR A MATERIAL SUPPLY SYSTEM AND MATERIAL SUPPLY METHOD

(71) Applicant: HORIBA STEC, Co., Ltd., Kyoto (JP)

(72) Inventors: Akihiro Taguchi, Kyoto (JP); Kensuke Tsuji, Kyoto (JP); Yuki Mizuyama, Kyoto (JP); Akihiro Nakamura, Kyoto (JP); Shin Matsuda, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 24 days.

(21) Appl. No.: 17/684,212

(22) Filed: Mar. 1, 2022

(65) Prior Publication Data

US 2022/0283012 A1   Sep. 8, 2022

(30) Foreign Application Priority Data

Mar. 5, 2021 (JP) .................................. 2021-035414
Dec. 23, 2021 (JP) .................................. 2021-209359

(51) Int. Cl.
*G01F 23/24* (2006.01)
*G01F 25/20* (2022.01)

(52) U.S. Cl.
CPC ............ *G01F 23/248* (2013.01); *G01F 25/20* (2022.01)

(58) Field of Classification Search
CPC ........ B01B 1/005; B01D 1/0082; B01D 1/30; B01J 4/00; B01J 2219/00164; B01J 4/02;

(Continued)

(56) References Cited

U.S. PATENT DOCUMENTS 5,201,223 A * 4/1993 McQueen ............... G01F 1/002
73/304 R
5,321,633 A * 6/1994 Kataoka ................ G01F 23/246
702/53

(Continued)

FOREIGN PATENT DOCUMENTS

DE    3603539 A1    8/1987
DE    4232043 A1    3/1994

(Continued)

OTHER PUBLICATIONS

European Patent Office, Extended European Search Report Issued in Application No. 22159353.6, Aug. 4, 2022, Germany, 9 pages.

*Primary Examiner* — Lisa M Caputo
*Assistant Examiner* — Eric Sebastian Von Wald
(74) *Attorney, Agent, or Firm* — Alleman Hall & Tuttle LLP

(57) ABSTRACT

A rapid rise in the temperature of a liquid level sensor is prevented even at close to a vacuum atmosphere. In a material supply system that is equipped with a tank containing a liquid material and with the liquid level sensor that is provided inside the tank, and in which the liquid level sensor is a self-heating type of sensor that, when the liquid level sensor is generating heat as a result of being supplied with a predetermined normal energy, detects a liquid surface, there are provided a monitoring portion that monitors a detection value from an output signal from the liquid level sensor, and an energy control portion that, when the monitored detection value reaches a predetermined upper limit value, performs control in such a way that the energy supplied to the liquid level sensor is low-level energy that is lower than the normal energy.

11 Claims, 9 Drawing Sheets

(58) Field of Classification Search
CPC ........ B01J 7/02; C23C 16/448; C23C 14/246; C23C 14/54; C23C 14/543; C23C 16/4485; C23C 16/52; F22B 37/78; G01F 23/248; G01F 23/247; G01F 23/241; G01F 25/20; G01F 23/0007; G01F 23/22; G01F 23/246; G01F 23/804; G05D 9/12; H01L 21/67017; H01L 21/67248; H01L 21/67253; H01L 21/6715; H01L 21/67259; H05B 1/0244; H05B 1/0247
See application file for complete search history.

(56) References Cited

U.S. PATENT DOCUMENTS

| | | | |
|---|---|---|---|
| 5,881,207 A | | 3/1999 | DeBourg et al. |
| 9,423,286 B2 * | | 8/2016 | Nishimura ............ G01F 23/248 |
| 2002/0152809 A1 * | | 10/2002 | Shirai .................. G01F 23/248 |
| | | | 73/299 |
| 2006/0042375 A1 | | 3/2006 | Davis |
| 2007/0261735 A1 * | | 11/2007 | Yasumuro ........... G01F 23/2962 |
| | | | 137/154 |
| 2008/0080844 A1 * | | 4/2008 | Miller .................. F24H 15/414 |
| | | | 122/4 A |
| 2015/0052895 A1 * | | 2/2015 | Hsu ........................ F01K 25/08 |
| | | | 60/645 |
| 2017/0268919 A1 | | 9/2017 | Hirata et al. |
| 2019/0136370 A1 * | | 5/2019 | Taguchi .................. C23C 14/24 |
| 2020/0088561 A1 | | 3/2020 | Hidaka et al. |
| 2020/0271503 A1 * | | 8/2020 | Asanuma ............. G01F 23/248 |
| 2021/0041284 A1 * | | 2/2021 | Yednak, III .......... G01F 23/268 |

FOREIGN PATENT DOCUMENTS

| | | |
|---|---|---|
| JP | 07-063592 A | 3/1995 |
| JP | 2012159341 A | 8/2012 |
| WO | 2018123854 A1 | 7/2018 |

* cited by examiner

MATERIAL SUPPLY SYSTEM, A STORAGE MEDIUM STORING A PROGRAM FOR A MATERIAL SUPPLY SYSTEM AND MATERIAL SUPPLY METHOD

TECHNICAL FIELD

The present invention relates to a material supply system such as a vaporization system that is used to supply material gases, which are obtained, for example, by vaporizing a liquid material, to a processing chamber for semiconductor manufacturing, and to a program for a material supply system, and a material supply method.

TECHNICAL BACKGROUND

As is shown in Patent Document 1, this type of vaporization system may be equipped with a tank containing a liquid material, and with a liquid level sensor that is provided inside the tank.

More specifically, as is typified by a Pt sensor, for example, this liquid level sensor is a self-heating type of sensor that generates heat when supplied with a constant current, and is formed so as to be able to detect a liquid surface due to the fact that there is a decrease in the temperature being detected when a liquid material comes into contact with the heated sensor.

However, in a case in which a self-heating type of liquid level sensor is used, as is shown in FIG. 9, as the vaporization of the liquid material proceeds so that the interior of the tank comes close to being a vacuum atmosphere, the heat from the liquid level sensor no longer escapes into the surrounding atmosphere and there is a rapid rise in the detected temperature. This gives rise to a variety of problems such as a decrease in the lifespan of the liquid level sensor, a deformation of the protective tube and the like forming part of the liquid level sensor, harmful effects on the liquid material and the vaporization material, and a shift in the sensor detection values and the like.

DOCUMENTS OF THE PRIOR ART

Patent Documents

Patent Document 1 WO No. 2018-123854

DISCLOSURE OF THE INVENTION

Problems to be Solved by the Invention

The present invention was therefore conceived in order to solve the above-described problems, and it is a principal object thereof to prevent the temperature of a liquid lever sensor from rising rapidly even in cases in which the vaporization of the liquid material advances so that the interior of the tank comes close to being a vacuum atmosphere.

Means for Solving the Problem

Namely, a material supply system according to the present invention is characterized in that, in a material supply system that is equipped with a tank containing a liquid material and with a liquid level sensor that is provided inside the tank, and in which the liquid level sensor is a self-heating type of sensor that, in a state in which the liquid level sensor is generating heat as a result of being supplied with a predetermined normal energy, detects a liquid surface, there are provided a monitoring portion that monitors a detection value obtained based on an output signal from the liquid level sensor, and an energy control portion that, in a case in which the detection value monitored by the monitoring portion reaches a predetermined upper limit value, controls the energy supplied to the liquid level sensor in such a way that that this energy is low-level energy that is lower than the normal energy.

If this type of material supply system is employed, then in a case in which the vaporization of the liquid material advances so that the interior of the tank comes close to being a vacuum atmosphere, although there is a rise in the detection value of the temperature and the like detected by the liquid level sensor, when this detection value reaches a predetermined upper limit value, because the energy supplied to the liquid level sensor is controlled so as to be low-level energy, it is possible to prevent the temperature of the liquid level sensor from rising rapidly.

As a consequence of this, it is possible to forestall various problems from occurring such as a decrease in the lifespan of the liquid level sensor, a deformation of the protective tube and the like forming part of the liquid level sensor, harmful effects on the liquid material and the vaporization material, and a shift in the sensor detection value and the like.

Even if the supply of energy to the liquid level sensor is stopped once the detection value reaches a predetermined upper limit value, temperature detection by the liquid level sensor subsequently becomes impossible, and it is difficult to determine appropriate timings when the energy that is being supplied should be restored to the normal energy.

For this reason, it is preferable that the low-level energy be greater than zero, and that the supply of energy to the liquid level sensor be continued even after the detection value monitored by the monitoring portion has reached the predetermined upper limit value.

If this type of structure is employed, then because it is possible to continue monitoring the detection value even after the detection value has reached the upper limit value, it is possible to determine an appropriate timing for restoring the energy being supplied to the normal energy level.

It is also preferable that, in a case in which the detection value monitored by the monitoring portion reaches a predetermined lower limit value, the energy control portion restores the energy being supplied to the liquid level sensor to the normal energy level.

If this type of structure is employed, after the detection value has reached the predetermined lower limit value and the temperature of the liquid level sensor has fallen to an appropriate temperature, it is possible to restore the energy being supplied to the normal energy level.

An example of a more specific aspect of the present invention is a mode in which, based on predetermined calculation data, the monitoring portion calculates a temperature from the output signal as the detection value, and the calculation data in a case in which the normal-level energy is being supplied to the liquid level sensor and the calculation data in a case in which the low-level energy is being supplied to the liquid level sensor are mutually different from each other.

If this type of structure is employed, it is possible for the temperature of the liquid level sensor to continue to be accurately calculated both before and after the temperature that forms the detection value reaches the predetermined upper limit value.

As a specific structure for supplying normal energy, a structure that is provided with a constant current circuit that supplies a fixed constant current to the liquid level sensor as the normal energy is preferable.

If this type of structure is employed, then because it is possible to supply a constant current regardless of any differences in the resistance values of the resistive elements forming the liquid level sensor, it is possible, for example, to immediately detect that the tank has become dry. In addition, a circuit having a simple circuit structure can be used to calculate the temperature.

In recent years, there has been a demand for greater responsiveness in liquid level sensors, and reducing the size of the liquid level sensor so as to reduce the heat capacity thereof may be considered as one way of achieving this. However, in this case, the problem of this reduced size leading to a rapid rise in the temperature of the liquid level sensor becomes far more conspicuous.

In consideration of this, as an aspect that enables the above-described actions and effects of the present invention to be more clearly demonstrated, it is also possible for the liquid level sensor to be provided with a resistive element that generates heat as a result of being supplied with energy, and a protective tube that houses the resistive element, and for a tube diameter of the protective tube to be not more than 3.2 mm.

In this way, while it is possible, conventionally, to achieve an improvement in the responsiveness of the liquid level sensor by using a small-diameter protective tube, the rapid rise in temperature that occurs when the interior of the tank comes close to being a vacuum atmosphere becomes more conspicuous. However, if the above-described structure is employed, then the above-described actions and effects are demonstrated, so that it is possible to achieve both an improvement in responsiveness and a prevention of a rise in temperature, which, in the conventional technology, are in a mutually exclusive relationship with one needing to be traded off for the other.

An example of a more specific aspect is a mode in which there is further provided a flow rate control device that is provided downstream from the tank, and controls a flow rate of a material gas that is obtained by vaporizing the liquid material.

Furthermore, a program for a material supply system according to the present invention is characterized in that, via a program that is used in a material supply system that is equipped with a tank containing a liquid material and with a liquid level sensor that is provided inside the tank, and in which the liquid level sensor is a self-heating type of sensor that, in a state in which the liquid level sensor is generating heat as a result of being supplied with a predetermined normal energy, detects a liquid surface, a computer is made to function as a monitoring portion that monitors a detection value obtained based on an output signal from the liquid level sensor, and as an energy control portion that, in a case in which the detection value monitored by the monitoring portion reaches a predetermined upper limit value, controls the energy supplied to the liquid level sensor in such a way that that this energy is low-level energy that is lower than the normal energy.

In addition to this, a material supply method according to the present invention is characterized in that, in a method that uses a material supply system that is equipped with a tank containing a liquid material and with a liquid level sensor that is provided inside the tank, and in which the liquid level sensor is a self-heating type of sensor that, in a state in which the liquid level sensor is generating heat as a result of being supplied with a predetermined normal energy, detects a liquid surface, there is provided a monitoring step in which a detection value obtained based on an output signal from the liquid level sensor is monitored, and an energy control step in which, in a case in which the detection value monitored by the monitoring portion reaches a predetermined upper limit value, the energy supplied to the liquid level sensor is controlled in such a way that that this energy is low-level energy that is lower than the normal energy.

According to the program for a material supply system and the material supply method described above, it is possible to achieve the same types of actions and effects as those obtained from the above-described material supply system.

Moreover, a material supply system according to the present invention is characterized in that, in a material supply system that is equipped with a tank containing a liquid material and with a liquid level sensor that is provided inside the tank, and in which the liquid level sensor is a self-heating type of sensor that, in a state in which the liquid level sensor is generating heat as a result of being supplied with a predetermined normal energy, detects a liquid surface, there are provided a pressure sensor that detects pressure inside the tank, and an energy control portion that, in a case in which a pressure value detected by the pressure sensor falls below a predetermined threshold value, controls the energy supplied to the liquid level sensor in such a way that that this energy is low-level energy that is lower than the normal energy.

If this type of material supply system is employed, then as the vaporization of the liquid material advances so that the interior of the tank comes close to being a vacuum atmosphere, and a pressure value detected by the pressure sensor drops below a threshold value, because the energy supplied to the liquid level sensor is controlled so as to be low-level energy, it is possible to prevent the temperature of the liquid level sensor from rising rapidly.

Effects of the Invention

According to the above-described present invention, it is possible to prevent a rapid rise in the temperature of a liquid level sensor even in a case in which the vaporization of the liquid material advances so that the interior of the tank comes close to being a vacuum atmosphere, and it is possible to forestall various problems from occurring such as a decrease in the lifespan of the liquid level sensor, a deformation of the protective tube and the like forming part of the liquid level sensor, harmful effects on the liquid material and the vaporization material, and a shift in the sensor detection values and the like.

BEST EMBODIMENTS FOR IMPLEMENTING THE INVENTION

Hereinafter, a material supply system according to an embodiment of the present invention will be described with reference to the drawings.

Device Structure

A material supply system 100 of the present embodiment is used to supply a liquid material, or to supply a material gas obtained by vaporizing a liquid material to a predetermined supply destination. Here, the material supply system 100 is a vaporization system that is incorporated, for example, into a semiconductor manufacturing line or the like, and is used to supply a material gas at a predetermined flow rate to a chamber where a semiconductor manufacturing process is being performed.

Figure 1:
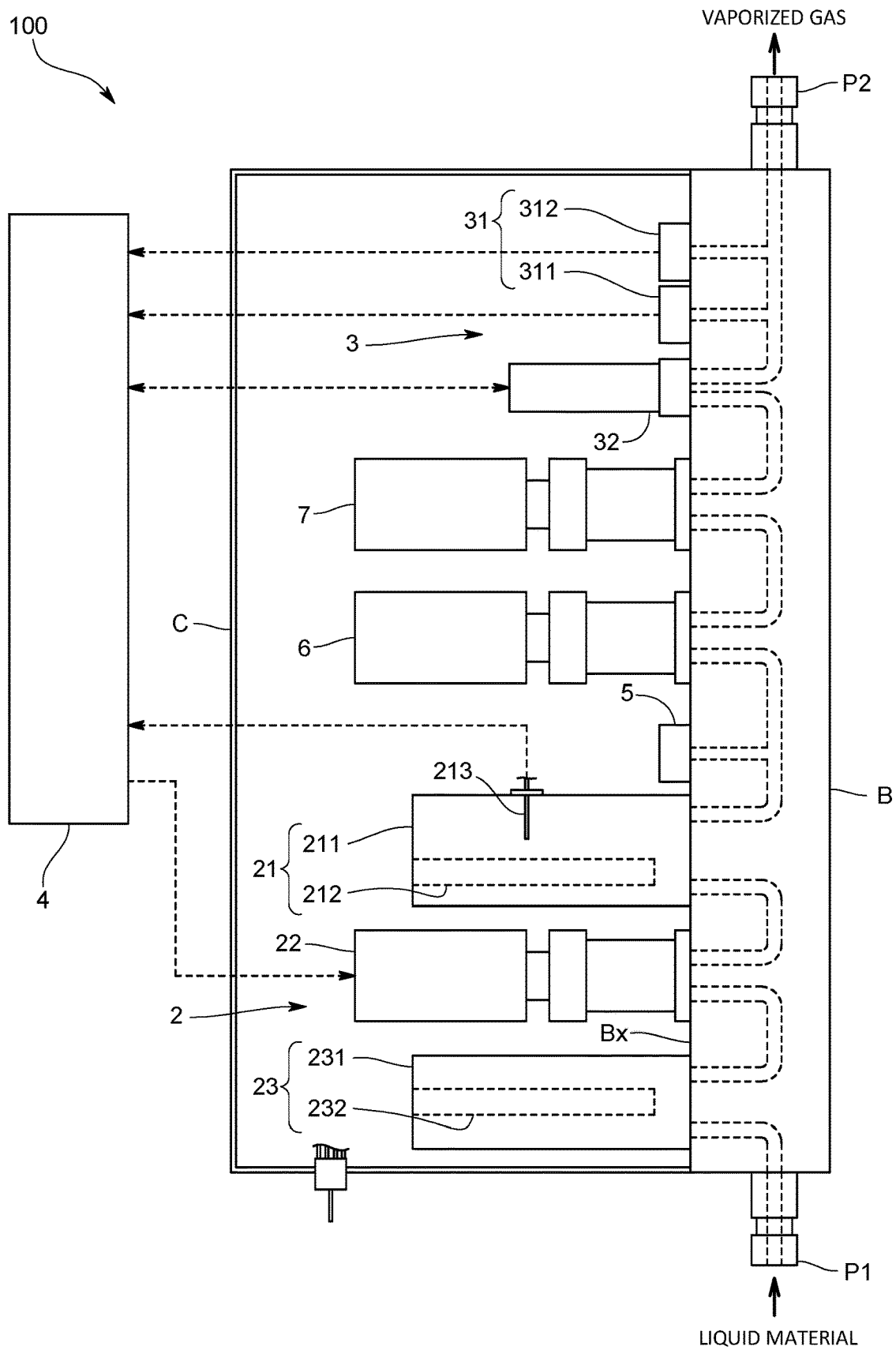
FIG. 1 is a schematic view showing an overall structure of a material supply system according to an embodiment of the present invention.

More specifically, as is shown in FIG. 1, this vaporization system 100 is equipped with a vaporization portion 2 that vaporizes a liquid raw material, a mass flow controller 3 in the form of a flow rate control device that controls a flow rate of a gas vaporized by the vaporization portion 2, and a control device 4 that controls operations of the vaporization portion 2 and the mass flow controller 3. Note that the vaporization portion 2 and the mass flow controller 3 are housed inside a casing C that is formed approximately in a pillar shape (more specifically, approximately in a rectangular parallelepiped shape) having a longitudinal direction. An intake port P1 that is used to introduce a liquid material is provided on one end side in the longitudinal direction of the casing C, and a discharge port P2 that is used to discharge vaporized gas is provided at another end side in the longitudinal direction thereof.

The vaporization portion 2 is provided with a vaporizer 21 that vaporizes a liquid material using a baking method, a supply rate control device 22 that controls a rate of supply of the liquid material to the vaporizer 21, and a preheater 23 that preheats the liquid material supplied to the vaporizer 21 to a predetermined temperature.

The vaporizer 21, supply rate control device 22, and preheater 23 are mounted on one surface of a main body block B, which is a manifold block in which an internal flow path is formed. Here, the main body block B is made from a metal such as, for example, stainless steel or the like, and is formed approximately in a pillar shape (more specifically, approximately in a rectangular parallelepiped shape) having a longitudinal direction. The main body block B has a device mounting surface Bx that is formed in a rectangular shape having a longitudinal direction. Note that the main body block B is installed on a semiconductor manufacturing line or the like in such a way that the longitudinal direction thereof extends in an up-down direction (i.e., in a vertical direction).

The vaporizer 21 includes a retention vessel 211 in the form of a vaporization tank that internally contains a liquid material, and a vaporization heater 212 that is provided in the retention vessel 211 and is used to vaporize the liquid material.

In addition, a liquid level sensor 213 that is used to detect the retention level of the liquid material being retained is also provided in the retention vessel 211. In the present embodiment, this liquid level sensor 213 is installed by being inserted through an upper wall of the retention vessel 211 into the interior thereof.

The liquid level sensor 213 of the present embodiment is what is known as a self-heating type of sensor that detects a peripheral temperature. In a normal operation, the liquid level sensor 213 detects a liquid surface while in a state of generating heat as a result of a predetermined normal energy being supplied thereto. Note that 'normal operation' refers to a state in which a liquid surface of a liquid material retained in the retention vessel 211 is able to be detected by the liquid level sensor 213 and, in the present embodiment, is a state in which a fixed constant current is supplied as normal energy to the liquid level sensor 213.

Figure 2:
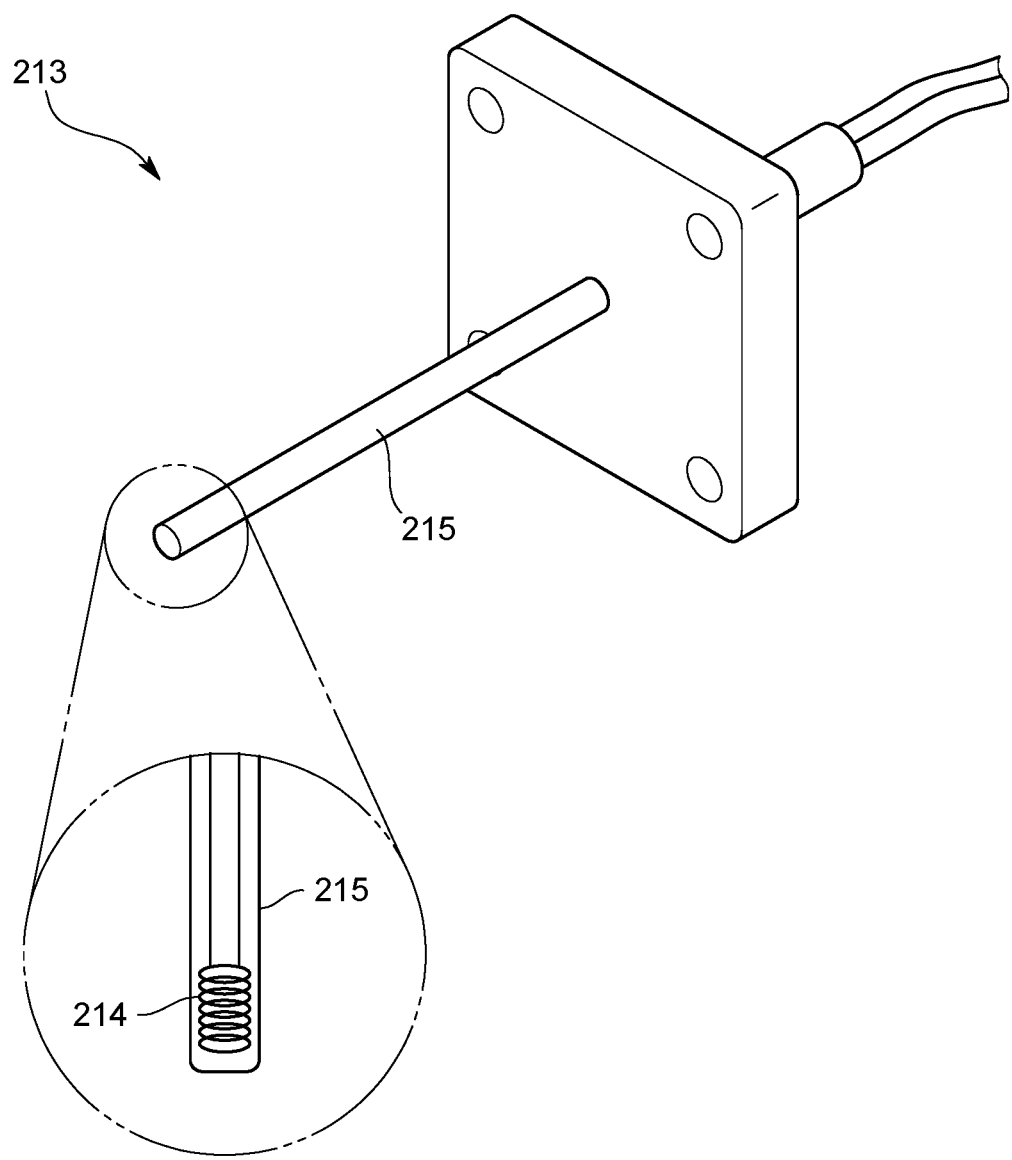
FIG. 2 is a schematic view showing a structure of a liquid level sensor of the same embodiment.

As is shown in FIG. 2, the liquid level sensor 213 includes a resistive element 214 that generates heat when supplied with energy, and a protective tube 215 that houses the resistive element 214. Here, the liquid level sensor 213 is a Pt sensor that utilizes a platinum resistive element 214. More specifically, the liquid level sensor 213 utilizes the fact that the resistivity of the resistive element 214 varies due to changes in the peripheral temperature. A voltage at each end of the resistive element 214 is output as an output signal, and the peripheral temperature is detected based on the size of this voltage. Because the detected temperature decreases as a result of the liquid material coming into contact with the liquid level sensor 213 while this is generating heat, this enables the liquid surface to be detected. Note that, in the liquid level sensor 213 used here, in order to obtain a high level of responsiveness, a narrow-diameter tube, specifically, a tube having a tube diameter (i.e., an inner diameter) of 3.2 mm or less, is used for the protective tube 215.

The supply rate control device 22 is a control valve that controls the supply flow rate of the liquid material to the vaporizer 21. In the present embodiment, the supply rate control device 22 is formed by an electromagnetic ON-OFF valve. The control device 4 (described below) controls the electromagnetic ON-OFF valve 22 (for example, by performing ON/OFF control) based on a detection signal from the above-described liquid level sensor 213 in such a way that the quantity of liquid material retained in the retention vessel 211 is constantly maintained at a predetermined quantity. As a result, liquid material is intermittently supplied to the vaporizer 21.

The preheater 23 includes a preheating block 231 in which is formed an internal flow path through which the liquid material is able to flow, and a preheating element 232 that is provided in this preheating block 231 and is used to preheat the liquid material. The liquid material is heated to a temperature slightly lower than a vaporization temperature (i.e., to less than boiling point) by this preheater 23.

Using the vaporization portion 2 that is formed in the above-described manner, liquid material introduced via the intake port P1 is preheated to a predetermined temperature as a result of being made to flow through the flow path inside the preheater 23. The liquid material preheated by this preheater 23 is introduced intermittently into the vaporizer 21 via control performed by the electromagnetic ON-OFF valve 22, which is serving as a supply rate control device. Consequently, vaporized gas created as a result of the liquid material being vaporized inside the vaporizer 21 is continuously produced and extracted to the mass flow controller 3.

Next, the mass flow controller 3 will be described.

The mass flow controller 3 is provided downstream from the above-described vaporization portion 2, and controls the flow rate of the material gas that is generated as a result of the liquid material being vaporized by the vaporization portion 2. More specifically, the mass flow controller 3 is provided with a fluid detection device 31 that detects vaporized gas flowing through the flow path, and a flow rate control valve 32 that controls the flow rate of the vaporized gas flowing through the flow path. Note that the fluid detection device 31 is formed by, for example, an electrostatic capacitance-type first pressure sensor 311 that detects pressure on the upstream side of a fluid resistor (not shown in the drawings) provided on the flow path, and by, for example, an electrostatic capacitance-type second pressure sensor 312 that detects pressure on the downstream side of the fluid resistor 313. The flow rate control valve 32 is a control valve that controls the flow rate of the vaporized gas created by the vaporizer 21. In the present embodiment, the flow rate control valve 32 is a piezo valve. Note that the mass flow controller 3 is not restricted to being a differential pressure type of device, such as is described above, and may instead be a thermal type of device.

The fluid detection device 31 and the flow rate control valve 32 are mounted on the device mounting surface Bx. More specifically, the fluid detection device 31 and the flow rate control valve 32 are mounted on the device mounting surface Bx in a row extending in the longitudinal direction thereof.

Note that, in the present embodiment, an upstream-side pressure sensor 5, an ON-OFF valve 6, and a purge valve 7 are provided on the upstream side of the mass flow controller 3.

Next, the control device 4 will be described.

The control device 4 is formed so as to supply liquid material to the vaporizer 21 during a vaporization operation by controlling the above-described electromagnetic ON-OFF valve 22.

Figure 3:
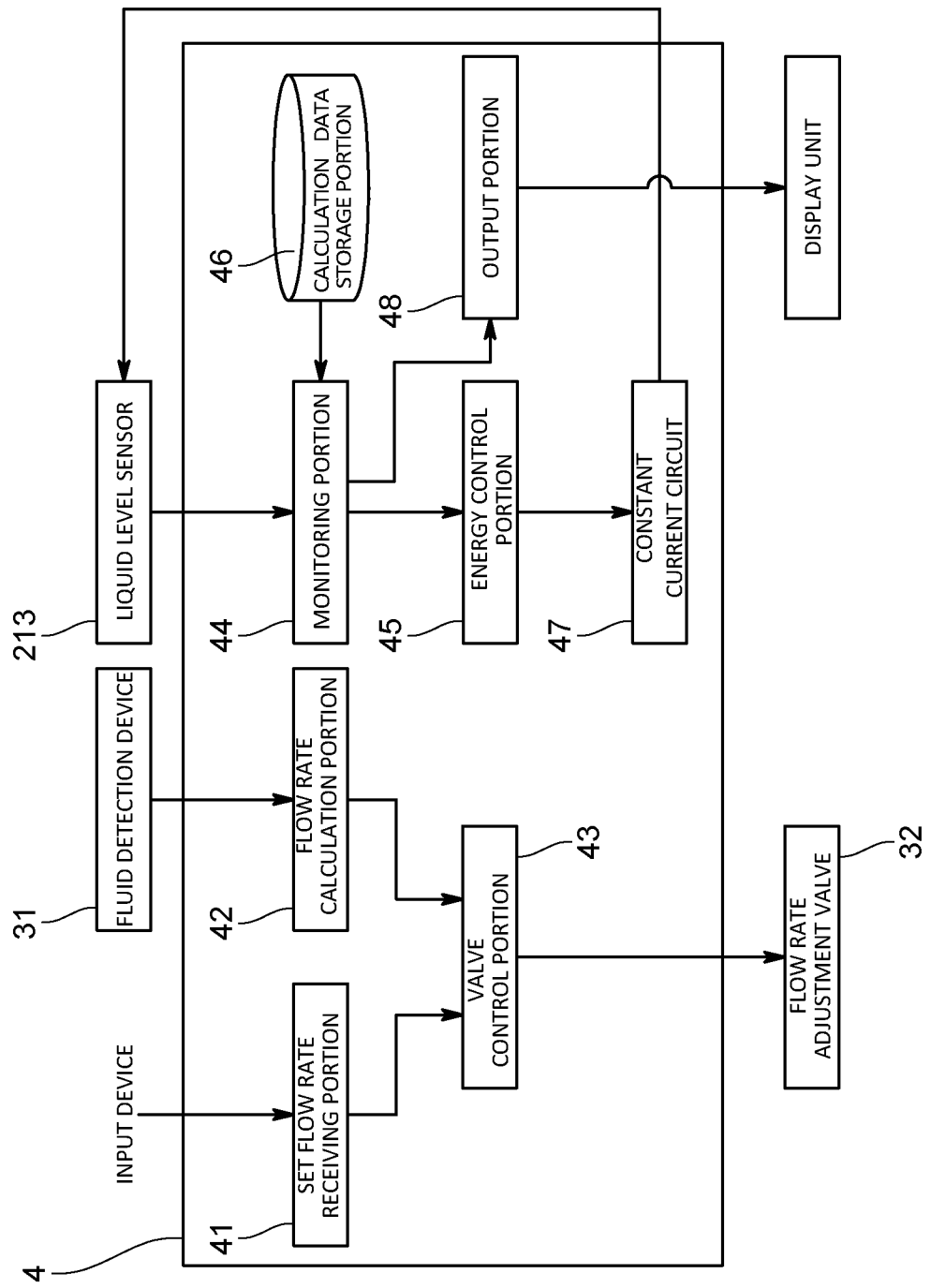
FIG. 3 is a function block diagram showing functions of a control device of the same embodiment.

More specifically, the control device 4 is a computer that includes a CPU, memory, an AC/DC converter, and input devices and the like. As a result of the CPU and the peripheral devices thereof operating in mutual collaboration in accordance with a program for a material supply system that is stored in the memory, as is shown in FIG. 3, the control device 4 functions as a set flow rate receiving portion 41, a flow rate calculation portion 42, a valve control portion 43, a monitoring portion 44, and an energy control portion 45.

Hereinafter, each of these portions will be described.

The set flow rate receiving portion 41 receives set flow rate signals that show a set flow rate transmitted either as a result of an input operation performed by a user on an input device such as, for example, a keyboard or the like, or from another device.

The flow rate calculation portion 42 acquires an output signal from the fluid detection device 31, and calculates a flow rate of the vaporized gas discharged from the vaporization portion 2.

The valve control portion 43 controls the flow rate control valve 32 based on the set flow rate and on a measured flow rate calculated by the flow rate calculation portion 42. Here, the valve control portion 43 performs feedback control on the valve aperture by outputting a drive signal to the flow rate control valve 32 so as to cause the measurement flow rate to match the set flow rate.

Figure 4:
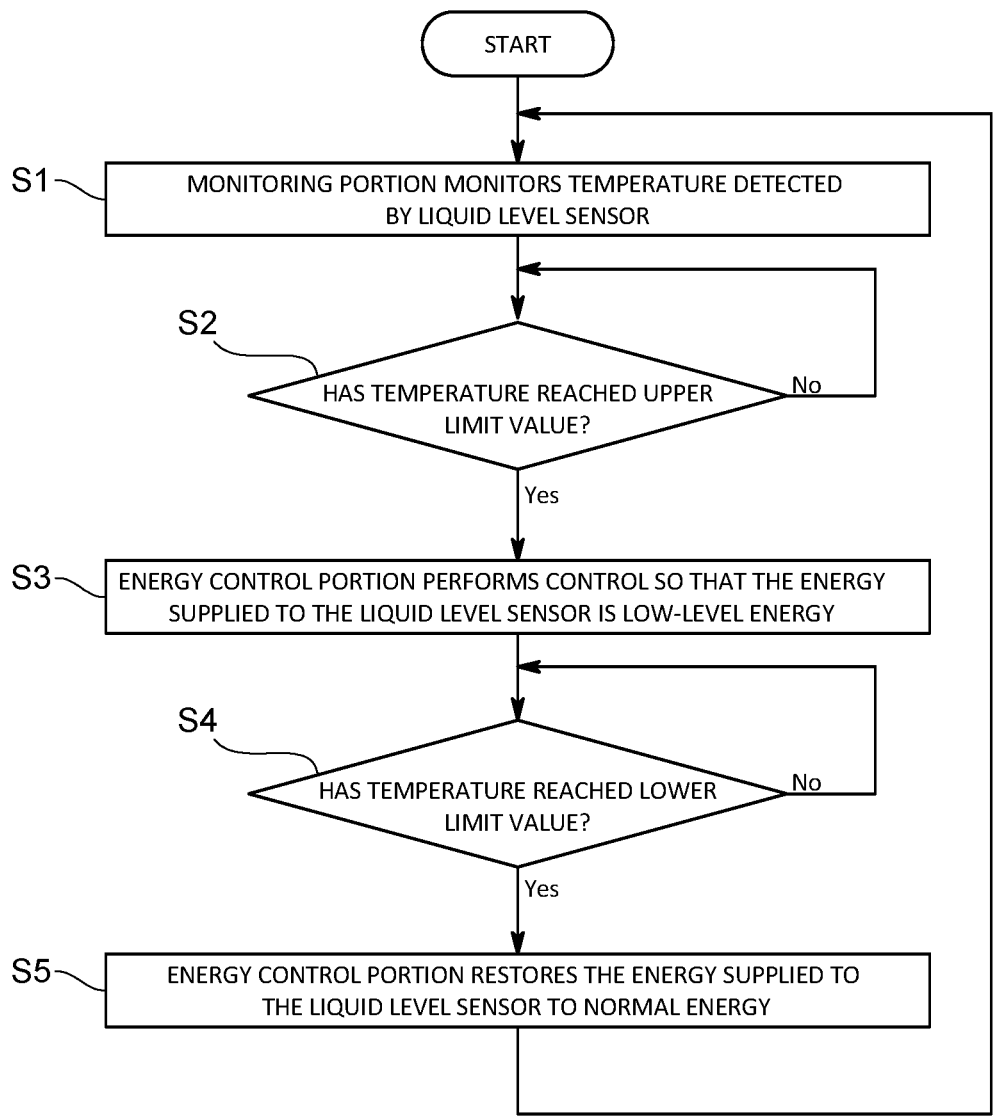
FIG. 4 is a flowchart showing an operation of the control device of the same embodiment.

Next, functions of the monitoring portion 44 and the energy control portion 45 will be described with reference to the flowchart shown in FIG. 4 in conjunction with a description of the operations thereof.

When a vaporization operation commences, the monitoring portion 44 acquires the output signal from the liquid level sensor 213, and monitors the detection value obtained based on this output signal. The monitoring portion 44 in this case acquires, as the output signal, the voltage at each end of the above-described resistive element 214, and also converts the size of this voltage into a temperature. The monitoring portion 44 then monitors this temperature (S1).

In the present embodiment, calculation data that is used to calculate the detection value from the output signal from the liquid level sensor 213 is stored in a calculation data storage portion 46 that is set in a predetermined area of the memory. More specifically, this calculation data is in the form of, for example, calculation data or lookup tables or the like. Using this calculation data, the monitoring portion 44 converts the voltage output from the liquid level sensor 213 into a temperature.

The energy control portion 45 controls the energy supplied to the liquid level sensor 213 based on the temperature monitored by the monitoring portion 44.

In this way, the energy control portion 45 compares the detection value monitored by the monitoring portion 44 with a predetermined upper limit value (S2), and in a case in which the detection value reaches the upper limit value, performs control in such a way that the energy supplied to the liquid level sensor 213 is low-level energy that is lower than the above-described normal energy (S3).

In other words, in a case in which the detection value monitored by the monitoring portion 44 is less than the predetermined upper limit value, the energy control portion 45 performs a normal operation and supplies normal energy to the liquid level sensor 213. In contrast, in a case in which the detection value monitored by the monitoring portion 44 reaches the predetermined upper limit value, the energy control portion 45 performs a protective operation so as to protect the liquid level sensor 213, and supplies low-level energy to the liquid level sensor 213. The size of the low-level energy is set so that the detection value from the liquid level sensor 213 decreases as a result of this low-level energy being supplied to the liquid level sensor 213, and may be set, for example, to not more than half the level of the normal energy. Note that it is also possible for the low-level energy to be set to zero.

More specifically, as is shown in FIG. 3, the control device 4 of the present embodiment is provided with a constant current circuit 47 that supplies a constant current to the liquid level sensor 213, and the energy control portion 45 controls this constant current circuit 47.

One aspect of the constant current circuit 47 is a switchable structure that, for example, as a result of a switching element being switched is able to be switched between a circuit structure for a normal operation that supplies a first constant current to the liquid level sensor 213 as the normal energy, and a circuit structure for a protective operation that supplies a second constant current, which is lower than the first constant current, to the liquid level sensor 213 as the low-level energy.

In a case in which the detection value monitored by the monitoring portion 44 reaches the predetermined upper limit value, the energy control portion 45 of the present embodiment switches the switching element so that the constant current circuit 47 is switched from the normal operation circuit structure to the protective operation circuit structure, and the energy being supplied to the liquid level sensor 213 is switched from the first constant current to the second constant current.

Here, the low-level energy that is supplied to the liquid level sensor 213 during a protective operation, in other words, the second constant current is greater than zero, and during the protective operation performed after the detection value monitored by the monitoring portion 44 has reached the predetermined upper limit value, this energy continues to be supplied to the liquid level sensor 213.

For this reason, the monitoring portion 44 of the present embodiment continuously monitors the temperature detected by the liquid level sensor 213 even during a protective operation. In other words, during a normal operation, the monitoring portion 44 calculates the temperature detected by the liquid level sensor 213 using the first constant current, and during a protective operation, calculates the temperature detected by the liquid level sensor 213 using the second constant current.

More specifically, calculation data for a normal operation and calculation data for a protective operation are stored in the above-described calculation data storage portion 46. These sets of calculation data are mutually different from each other, and in a case in which, for example, a calculation formula is used for the calculation data, functions and the like that are included in this calculation formula are set to mutually different values that correspond to the first constant current and the second constant current.

In this structure, during a normal operation which is performed when the detection value monitored by the monitoring portion 44 has not reached the predetermined upper limit value, the first constant current is supplied by the energy control portion 45 to the liquid level sensor 213, and the monitoring portion 44 calculates and monitors the temperature detected by the liquid level sensor 213 using the normal operation calculation data.

In contrast, during a protective operation which is performed when the detection value monitored by the monitoring portion 44 has reached the predetermined upper limit value, the second constant current is supplied by the energy control portion 45 to the liquid level sensor 213, and the monitoring portion 44 calculates and monitors the temperature detected by the liquid level sensor 213 using the protective operation calculation data.

In addition, in this protective operation, the energy control portion 45 compares the detection value monitored by the monitoring portion 44 with a predetermined lower limit value (S4), and in a case in which the detection value reaches the lower limit value restores the energy being supplied to the liquid level sensor 213 to the first constant current, which is low-level energy (S5).

Thereafter, the control device 4 repeats S1 through S5 until the vaporization operation is ended.

Note that it is also possible for the control device 4 to be provided with an output portion 48 that outputs the temperature monitored by the monitoring portion 44 by displaying this temperature on a display unit or the like. More specifically, during a normal operation, this output portion 48 may output the temperature monitored by the monitoring portion 44 by displaying this temperature on a display unit or the like and, during a protective operation, may output the temperature monitored by the monitoring portion 44 by displaying this temperature superimposed on the aforementioned display on the display unit.

Effects of the Present Embodiment

Figure 5:
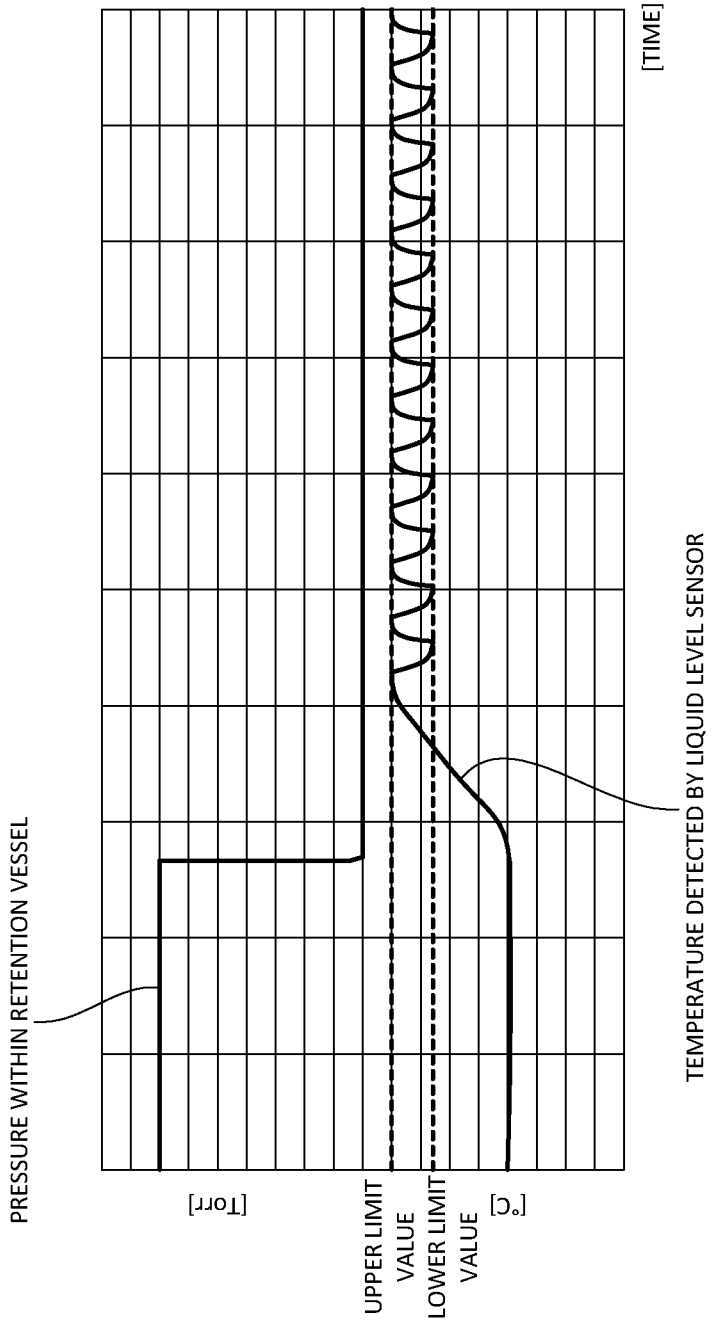
FIG. 5 is a graph showing a behavior of detection values from the liquid level sensor of the same embodiment.

According to the vaporization system 100 which is formed in the above-described manner, as is shown in FIG. 5, in a case in which the vaporization of the liquid material progresses so that the interior of the retention vessel 211 comes close to being a vacuum atmosphere, although there is a rise in the temperature detected by the liquid level sensor 213, because the energy supplied to the liquid level sensor 213 is controlled so as to decrease from the normal-level energy to the low-level energy when this temperature reaches the predetermined upper limit value, it is possible to prevent a rapid rise in the temperature of the liquid level sensor 213.

As a result, it is possible to forestall various problems from occurring such as a decrease in the lifespan of the liquid level sensor 213, deformation of the protective tube 215 and the like forming part of the liquid level sensor 213, harmful effects on the liquid material and the vaporization material, and a shift in the sensor detection values and the like.

Moreover, during a protective operation, because a low-level energy that is greater than zero is continuously supplied to the liquid level sensor 213, it is possible for the monitoring of the temperature by the monitoring portion 44 to be continued during this protective operation as well, and for an appropriate timing for restoring the energy being supplied to the normal energy level to be determined.

Furthermore, because a small-diameter tube having a tube diameter of 3.2 mm or less is used as the protective tube 215 in the liquid level sensor 213 of the present embodiment, an improvement in responsiveness can be achieved. In addition to this, before the rapid rise in temperature which occurs conventionally when the interior of the retention vessel 211 comes close to being a vacuum atmosphere becomes more conspicuous, the above-described actions and effects provided by the energy control portion 45 are demonstrated, so that it is possible to achieve both an improvement in responsiveness and a prevention of a rise in temperature, which, in the conventional technology, are in a mutually exclusive relationship with one needing to be traded off for the other.

Additional Embodiments

Figure 6:
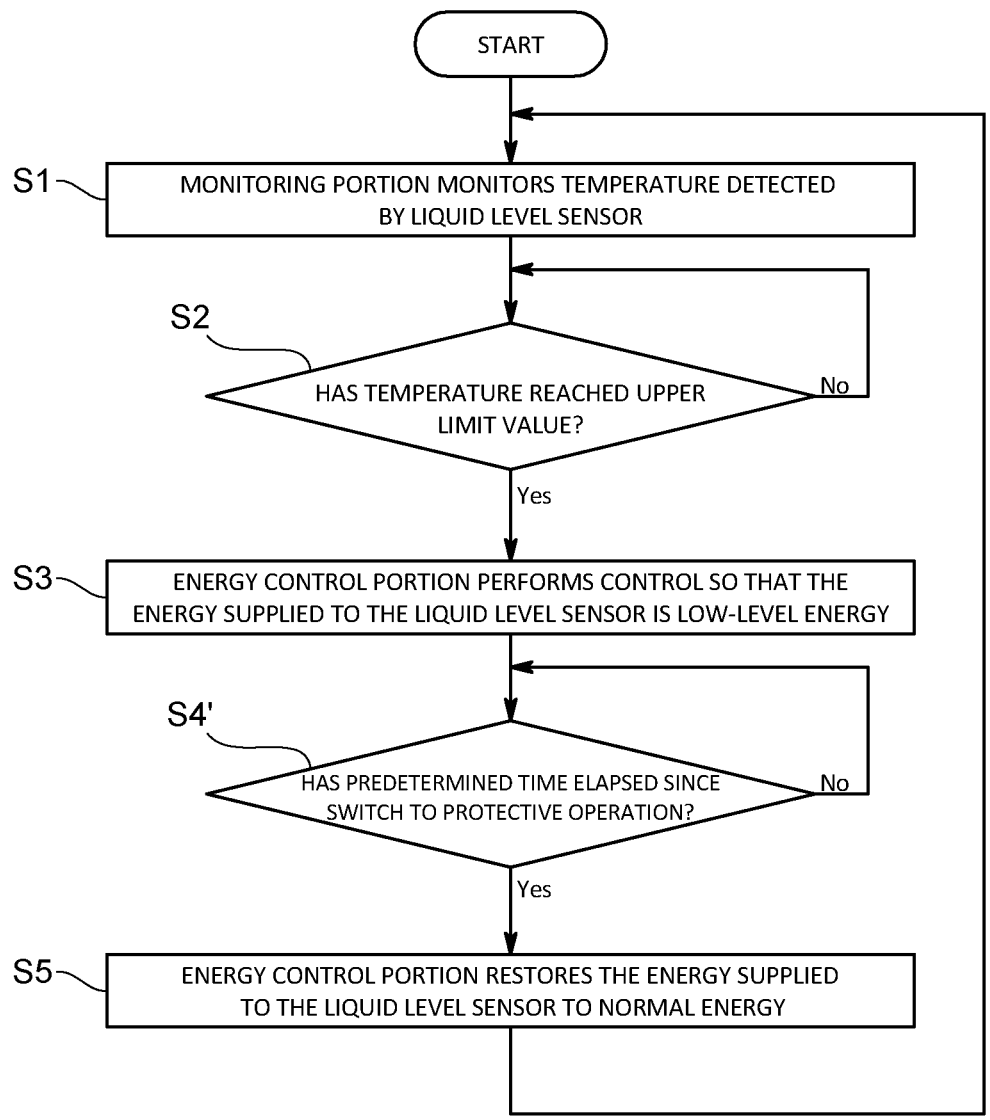
FIG. 6 is a flowchart showing an operation of a control device of an additional embodiment.

For example, in the energy control portion 45 of the above-described embodiment, a structure is employed in which, in a case in which the detection value monitored by the monitoring portion 44 reaches a predetermined lower limit value during a protective operation, the energy supplied to the liquid level sensor 213 is restored from the low-level energy to the normal-level energy, however, as is shown in FIG. 6, it is also possible to employ a structure in which, for example, a determination is made as to whether or not a predetermined period of time has elapsed since the point when the normal operation was switched to the protective operation (S4'), and if it is determined that this predetermined period of time has elapsed, the energy being supplied to the liquid level sensor 213 is restored from the low-level energy to the normal-level energy.

Moreover, in the above-described embodiment, a description is given of a structure in which the liquid level sensor 213 is supplied with a constant current from the constant current circuit 47, however, it is possible to instead employ a structure in which the liquid level sensor 213 is supplied with a constant voltage from a constant voltage circuit, or a structure in which the liquid level sensor 213 is supplied with constant power from a constant power circuit.

Note that in a case in which, as in the above-described embodiment, the constant current circuit 47 is used, because a constant current is able to be supplied irrespective of any variations in the resistance value of the resistive element forming part of the liquid level sensor 213, it is possible, for example, to immediately detect that the retention vessel 211 has become dry. In addition, a circuit having a simple circuit structure can be used to calculate the temperature.

In contrast, in a case in which a constant voltage circuit is used, when the retention vessel 211 comes close to being a vacuum atmosphere and the temperature of the liquid level sensor 213 has increased, because the resistance value of the resistive element 214 increases, there is a decrease in the current flowing to the resistive element 214, and a rise in temperature can be suppressed.

Moreover, in a case in which a constant power circuit is used, the sensitivity of the liquid level sensor 213 can be maintained at a constant level.

Furthermore, in the liquid level sensor 213 it is also possible to employ a structure in which, at the same time as a thermocouple (i.e., a resistive element) is heated using a small-sized heater, the liquid surface is detected using changes in the resistance value of the thermocouple. In this case, the supply energy such as current, voltage, or power or the like that is supplied to the heater may be controlled by the energy control portion 45.

In cases in which, for example, the level of responsiveness that is required is not particularly stringent, then the protective tube that is used to form part of the liquid level sensor 213 is not limited to having a tube diameter of 3.2 mm, and a larger tube diameter than this may instead be used.

In addition, in the above-described embodiment platinum is used for the resistive body 214 forming part of the liquid level sensor 213, however, it is also possible for copper or nickel or the like to be used instead.

The monitoring portion 44 of the above-described embodiment converts the voltage output from the liquid level sensor 213 into a temperature, and monitors this temperature as a detection value, however, it is also possible for the size of the voltage output from the liquid level sensor 213 to be monitored as a detection value instead. Moreover, in a case in which the liquid level sensor 213 is provided with a function of converting voltage into temperature, then it is also possible for a monitoring portion that monitors the temperature output from the liquid level sensor 213 as a detection value to be used as the monitoring portion 44.

It is sufficient if the control device 4 is provided with at least the functions performed by the monitoring portion 44 and the energy control portion 45, and either a portion of, or all of the functions performed by the set flow rate receiving portion 41, the flow rate calculation portion 42, and the valve control portion 43 may be provided in a separate computer.

Moreover, in the above-described embodiment, the vaporization system 100 that supplies a material gas obtained by vaporizing a liquid material to a processing chamber for manufacturing semiconductors is described as a material supply system, however, it is not necessary that the material supply system according to the present invention vaporize a liquid material, and it may instead be a system that supplies a material gas to a predetermined supply destination.

Figure 7:
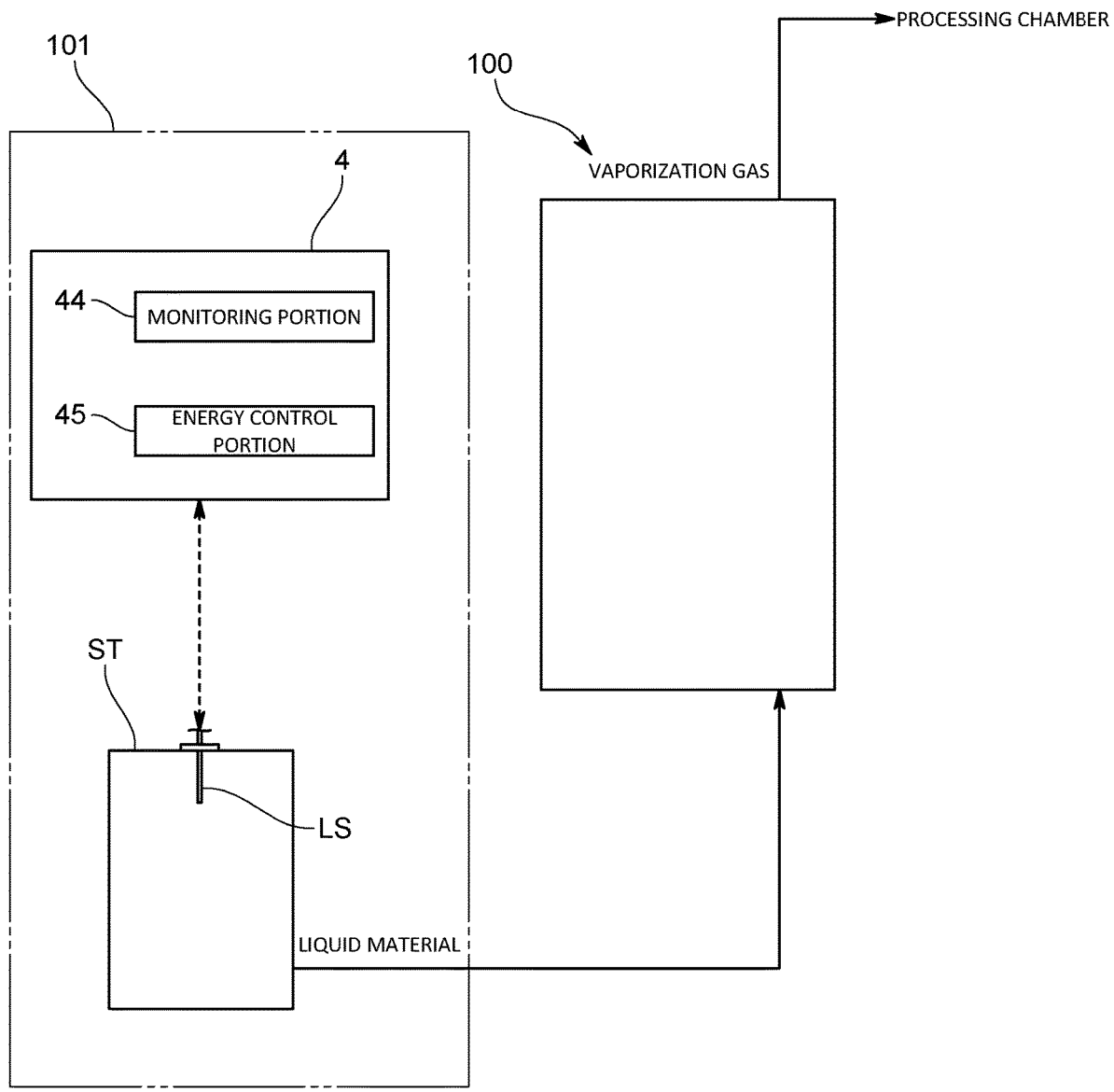
FIG. 7 is a schematic view showing an overall structure of a material supply system of an additional embodiment.

An example of this type of supply system is a material supply system 101 that, as is shown in FIG. 7, is provided, for example, with a sub tank ST that is provided upstream from the vaporization system 100 and contains liquid material, and with a self-heating type of liquid level sensor LS that is provided within this sub tank, and that supplies the liquid material retained in the sub tank ST to the vaporization system 100.

In this case, the monitoring portion 44 monitors a detection value obtained based on an output signal from the liquid level sensor provided within the sub tank, and in a case in which the detection value monitored by the monitoring portion 44 reaches a predetermined upper limit value, then the energy control portion 45 may perform control such that the energy being supplied to the liquid level sensor provided within the sub tank is set to the low-level energy.

Furthermore, it is also possible to employ a structure in which the material supply system 100 according to the present invention is provided with a pressure sensor that detects a pressure within the tank, and in a case in which a value of the pressure detected by the pressure sensor drops below a predetermined threshold value, then the energy control portion 45 may perform control such that the energy being supplied to the liquid level sensor 213 is set to the low-level energy.

More specifically, the pressure sensor is able to detect peripheral pressure around the liquid level sensor 213 within the retention vessel 211 forming the vaporization tank, and may be provided either within the retention vessel 211 or may be provided on a flow path communicating with the retention vessel 211. For example, the upstream-side pressure sensor 5 of the above-described embodiment may be used as this pressure sensor.

Once a vaporization operation has begun, the monitoring portion 44 acquires an output signal from the pressure sensor, and monitors the pressure value indicated by this output signal.

In this structure, the energy control portion 45 compares the pressure value monitored by the monitoring portion 44 with a predetermined threshold value, and in a case in which the pressure value drops below the threshold value, performs control in such a way that the energy supplied to the liquid level sensor 213 is set to low-level energy that is lower than the normal energy.

Figure 8:
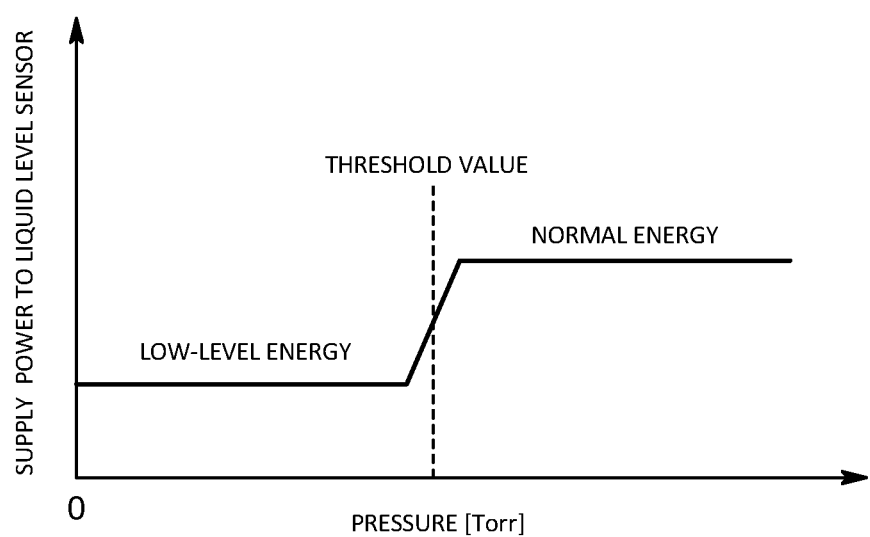
FIG. 8 is a graph illustrating an operation of a control device of an additional embodiment.
Figure 9:
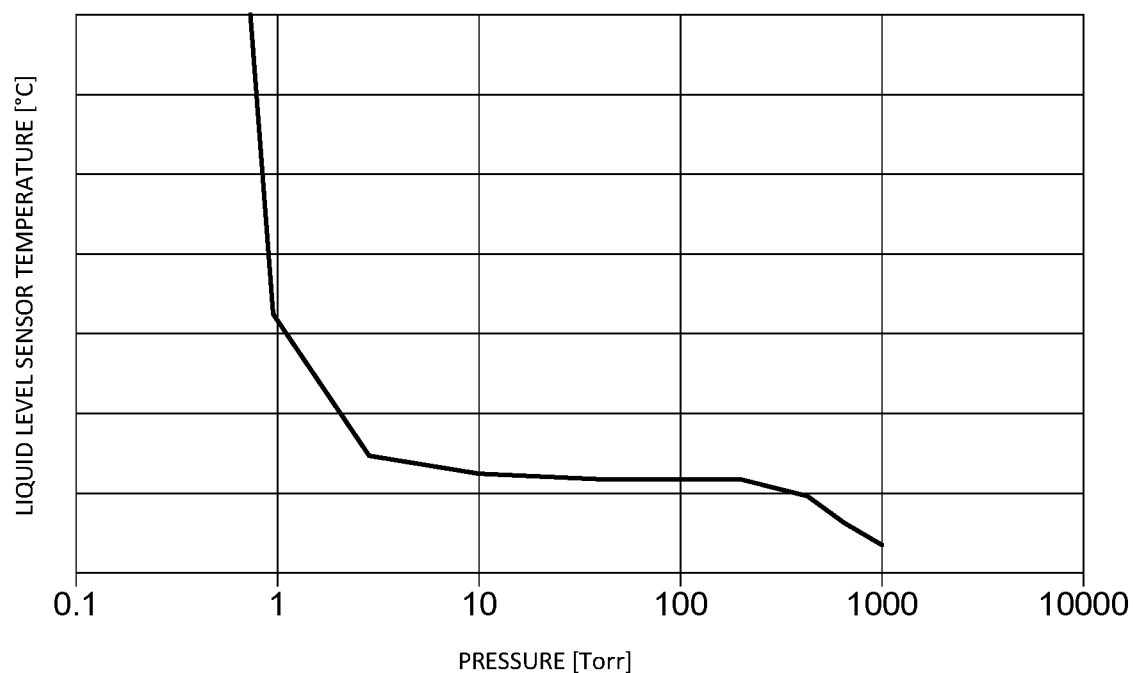
FIG. 9 is a graph showing a behavior of a detection value from a liquid level sensor in a conventional vaporization system.

In other words, as is shown in FIG. 8, in a case in which the pressure value monitored by the monitoring portion 44 is above the threshold value, a normal operation is performed and the energy control portion 45 supplies normal energy to the liquid level sensor 213. In contrast, in a case in which the pressure value monitored by the monitoring portion 44 falls below the predetermined threshold value, a normal operation to protect the liquid level sensor 213 is performed and the energy control portion 45 supplies low-level energy to the liquid level sensor 213.

Note that a specific aspect of the present invention that may be used to switch the energy supplied to the liquid level sensor 213 is the structure described in the foregoing embodiment.

By using the material supply system 100 that is formed in the manner described above, if the vaporization of the liquid material advances so that the interior of the retention vessel 211 comes close to being a vacuum atmosphere, then when the pressure value detected by the pressure sensor falls below a threshold value, because control is performed so that the energy supplied to the liquid level sensor 213 is low-level energy, it is possible to prevent the temperature of the liquid level sensor 213 from rising rapidly.

Furthermore, it should be understood that the present invention is not limited to the above-described embodiments, and that various modifications and the like may be made thereto insofar as they do not depart from the spirit or scope of the present invention.

DESCRIPTION OF THE REFERENCE CHARACTERS

100 . . . Vaporization System (Material Supply System)
2 . . . Vaporization Portion 21 ... Vaporizer
211 ... Retention Vessel (Tank)
212 ... Vaporization Heater
213 ... Liquid level Sensor
214 ... Resistive Element
215 ... Protective Tube
22 ... Supply Rate Control Device
23 ... Preheater
3 ... Mass Flow Controller
31 ... Fluid Detection Device
32 ... Flow Rate Control Valve
4 ... Control Device
44 ... Monitoring Portion
45 ... Energy Control Portion

What is claimed is:

1. A material supply system comprising:
a tank containing a liquid material;
a liquid level sensor that is provided inside the tank, wherein the liquid level sensor is a self-heating type of sensor that, in a state in which the liquid level sensor is generating heat as a result of being supplied with a first predetermined current, voltage, or power, detects a liquid surface;
a monitoring portion that monitors a temperature of the liquid level sensor obtained based on an output signal from the liquid level sensor;
a constant current/voltage/power circuit that switchably supplies a first constant current, voltage, or power and a second constant current, voltage, or power lower than the first constant current, voltage, or power to the liquid level sensor; and
an energy control portion that, in a case in which the temperature of the liquid level sensor monitored by the monitoring portion reaches a predetermined upper limit value, performs a protective operation that controls the constant current/voltage/power circuit to switch the current, voltage, or power supplied to the liquid level sensor from the first constant current, voltage, or power to the second constant current, voltage, or power to protect the liquid level sensor, wherein
the first constant current, voltage, or power is supplied to the liquid level sensor during a normal operation in which the temperature of the liquid level sensor monitored by the monitoring portion does not reach the predetermined upper limit value, and
the second constant current, voltage, or power is supplied to the liquid level sensor during the protective operation.

2. The material supply system according to claim 1, wherein the second constant current, voltage, or power is greater than zero, and
supply of the second constant current, voltage, or power to the liquid level sensor is continued even after the temperature of the liquid level sensor monitored by the monitoring portion has reached the predetermined upper limit value.

3. The material supply system according to claim 2, wherein, in a case in which the temperature of the liquid level sensor monitored by the monitoring portion reaches a predetermined lower limit value, the energy control portion restores the current, voltage, or power being supplied to the liquid level sensor to the first predetermined current, voltage, or power.

4. The material supply system according to claim 1, wherein, based on predetermined calculation data, the monitoring portion calculates the temperature of the liquid level sensor from the output signal, and
the calculation data in a case in which the first predetermined current, voltage, or power is being supplied to the liquid level sensor and the calculation data in a case in which the second constant current, voltage, or power is being supplied to the liquid level sensor are mutually different from each other.

5. The material supply system according to claim 1, comprising a constant current circuit that supplies a fixed constant current to the liquid level sensor as the first predetermined current.

6. The material supply system according to claim 1, wherein the liquid level sensor comprises a resistive element that generates heat as a result of being supplied with energy, and a protective tube that houses the resistive element, and a tube diameter of the protective tube is not more than 3.2 mm.

7. The material supply system according to claim 1, further comprising a flow rate control device that is provided downstream from the tank and controls a flow rate of a material gas that is obtained by vaporizing the liquid material.

8. A non-transitory storage medium storing a program used in a material supply system that is equipped with a tank containing a liquid material and with a liquid level sensor that is provided inside the tank, wherein the liquid level sensor is a self-heating type of sensor that, in a state in which the liquid level sensor is generating heat as a result of being supplied with a first predetermined current, voltage, or power, detects a liquid surface, wherein
the material supply system comprises a constant current/voltage/power circuit that switchably supplies a first constant current, voltage, or power and a second constant current, voltage, or power lower than the first constant current, voltage, or power to the liquid level sensor, and
the program causes a computer to function as:
a monitoring portion that monitors a temperature of the liquid level sensor obtained based on an output signal from the liquid level sensor; and as
an energy control portion that, in a case in which the temperature of the liquid level sensor monitored by the monitoring portion reaches a predetermined upper limit value, performs a protective operation that controls the constant current/voltage/power circuit to switch the current, voltage, or power supplied to the liquid level sensor from the first constant current, voltage, or power to the second constant current, voltage, or power to protect the liquid level sensor,
the first constant current, voltage, or power is supplied to the liquid level sensor during a normal operation in which the temperature of the liquid level sensor monitored by the monitoring portion does not reach the predetermined upper limit value, and
the second constant current, voltage, or power is supplied to the liquid level sensor during the protective operation.

9. A material supply method that uses a material supply system that is equipped with a tank containing a liquid material and with a liquid level sensor that is provided inside the tank, wherein the liquid level sensor is a self-heating type of sensor that, in a state in which the liquid level sensor is generating heat as a result of being supplied with a first predetermined current, voltage, or power, detects a liquid surface, wherein the material supply system comprises a constant current/voltage/power circuit that switchably supplies a first constant current, voltage, or power and a second constant current, voltage, or power lower than the first constant current, voltage, or power to the liquid level sensor, the method comprising:
- a monitoring step in which a temperature of the liquid level sensor obtained based on an output signal from the liquid level sensor is monitored; and
- an energy control step in which, in response to the monitored temperature of the liquid level sensor reaching a predetermined upper limit value, a protective operation is performed by controlling the constant current/voltage/power circuit to switch the current, voltage, or power supplied to the liquid level sensor from the first constant current, voltage, or power to the second constant current, voltage, or power to protect the liquid level sensor, wherein
- the first constant current, voltage, or power is supplied to the liquid level sensor during a normal operation in which the temperature of the liquid level sensor monitored by the monitoring portion does not reach the predetermined upper limit value, and
- the second constant current, voltage, or power is supplied to the liquid level sensor during the protective operation.

10. A material supply system comprising:
- a tank containing a liquid material;
- a liquid level sensor that is provided inside the tank, wherein the liquid level sensor is a self-heating type of sensor that, in a state in which the liquid level sensor is generating heat as a result of being supplied with a first predetermined current, voltage, or power, detects a liquid surface;
- a pressure sensor that detects pressure inside the tank;
- a constant current/voltage/power circuit that switchably supplies a first constant current, voltage, or power and a second constant current, voltage, or power lower than the first constant current, voltage, or power to the liquid level sensor; and
- an energy control portion that, in a case in which a pressure value detected by the pressure sensor falls below a predetermined threshold value, performs a protective operation that controls the constant current/voltage/power circuit to switch the current, voltage, or power supplied to the liquid level sensor from the first constant current, voltage, or power to the second constant current, voltage, or power to protect the liquid level sensor, wherein
- the first constant current, voltage, or power is supplied to the liquid level sensor during a normal operation in which the pressure value detected by the pressure sensor does not fall below the predetermined threshold value, and
- the second constant current, voltage, or power is supplied to the liquid level sensor during the protective operation.

11. A material supply system comprising:
- a tank containing a liquid material;
- a single liquid level sensor that is provided inside the tank, wherein the single liquid level sensor is a self-heating type of sensor that, in a state in which the single liquid level sensor is generating heat as a result of being supplied with a first predetermined current, voltage, or power, detects a liquid surface;
- a monitoring portion that monitors an output signal from the single liquid level sensor or a temperature of the single liquid level sensor obtained based on the output signal;
- a constant current/voltage/power circuit that switchably supplies a first constant current, voltage, or power and a second constant current, voltage, or power lower than the first constant current, voltage, or power to the single liquid level sensor; and
- an energy control portion that, in a case in which the output signal or the temperature of the single liquid level sensor monitored by the monitoring portion reaches a predetermined upper limit value, performs a protective operation that controls the constant current/voltage/power circuit to switch the current, voltage, or power supplied to the single liquid level sensor from the first constant current, voltage, or power to the second constant current, voltage, or power to protect the single liquid level sensor, wherein
- the first constant current, voltage, or power is supplied to the single liquid level sensor during a normal operation in which the output signal or the temperature of the single liquid level sensor monitored by the monitoring portion does not reach the predetermined upper limit value, and
- the second constant current, voltage, or power is supplied to the single liquid level sensor during the protective operation.

\* \* \* \* \*